(12) United States Patent　　　(10) Patent No.:　US 12,663,295 B2

Novak et al.　　　(45) Date of Patent:　Jun. 23, 2026

---

(54) EMBEDDED SENSORS

(71) Applicant: Ohio State Innovation Foundation, Columbus, OH (US)

(72) Inventors: Markus Novak, Dublin, OH (US); Lisa Militello, Columbus, OH (US); Asimina Kiourti, Columbus, OH (US)

(73) Assignee: Ohio State Innovation Foundation, Columbus, OH (US)

( * ) Notice: Subject to any disclaimer, the term of this patent is extended or adjusted under 35 U.S.C. 154(b) by 224 days.

(21) Appl. No.: 18/400,639

(22) Filed: Dec. 29, 2023

(65) Prior Publication Data

US 2024/0219209 A1　　　Jul. 4, 2024

Related U.S. Application Data

(60) Provisional application No. 63/436,199, filed on Dec. 30, 2022.

(51) Int. Cl.
| | |
|---|---|
| *G01D 5/24* | (2006.01) |
| *G01R 27/26* | (2006.01) |
| *G06F 3/044* | (2006.01) |
| *H03K 17/955* | (2006.01) |

(52) U.S. Cl.
CPC ........... *G01D 5/24* (2013.01); *G01R 27/2605* (2013.01); *H03K 17/955* (2013.01); *G06F 3/0446* (2019.05)

(58) Field of Classification Search
CPC ........ G01R 27/00; G01R 27/02; G01R 27/26; G01R 27/2605; G01D 5/00; G01D 5/12; G01D 5/14; G01D 5/24; G06F 3/00; G06F 3/01; G06F 3/03; G06F 3/041; G06F 3/044; G06F 3/0446; H03K 17/00; H03K 17/94; H03K 17/955

USPC ................................ 324/600, 649, 658, 686
See application file for complete search history.

(56) References Cited

U.S. PATENT DOCUMENTS

| | | | | |
|---|---|---|---|---|
| 8,115,499 | B2 * | 2/2012 | Osoinach | .............. G06F 3/0416 |
| | | | | 345/173 |
| 11,039,759 | B2 | 6/2021 | Kiourti et al. | |
| 11,163,399 | B2 * | 11/2021 | Yousefpor | ............. G06F 3/0446 |
| 2009/0090694 | A1 * | 4/2009 | Hotelling | .............. G06F 3/0443 |
| | | | | 216/41 |

(Continued)

FOREIGN PATENT DOCUMENTS

| | | | | |
|---|---|---|---|---|
| GB | 2453418 A | * | 4/2009 | ......... H03K 17/9622 |

OTHER PUBLICATIONS

Zhu, Keren, Lisa Militello, and Asimina Kiourti. "Antenna-Impregnated fabrics FOR Recumbent height measurement on the Go." IEEE Journal of Electromagnetics, RF and Microwaves in Medicine and Biology 2.1 (2018): 33-39.

*Primary Examiner* — Hoai-An D. Nguyen

(74) *Attorney, Agent, or Firm* — Meunier Carlin & Curfman LLC

(57) ABSTRACT

An example embedded sensor system is described herein. The example embedded sensor includes a plurality of transmission traces, a plurality of coupling traces; and a plurality of fringing field regions formed by adjacent transmission traces and coupling traces. Optionally, the embedded sensor system can include a processor operably coupled to a switch, and configured to: select a transmission trace and a coupling traces from the plurality of transmission traces and coupling traces using the switch; and measure a capacitance between the transmission trace and the coupling trace.

20 Claims, 12 Drawing Sheets

(56) References Cited

U.S. PATENT DOCUMENTS

2014/0368757 A1* 12/2014 Chen ..................... G06F 3/0443
                                                                    349/12
2015/0077383 A1*  3/2015 Kang .................... G06F 3/0446
                                                                    345/174

* cited by examiner

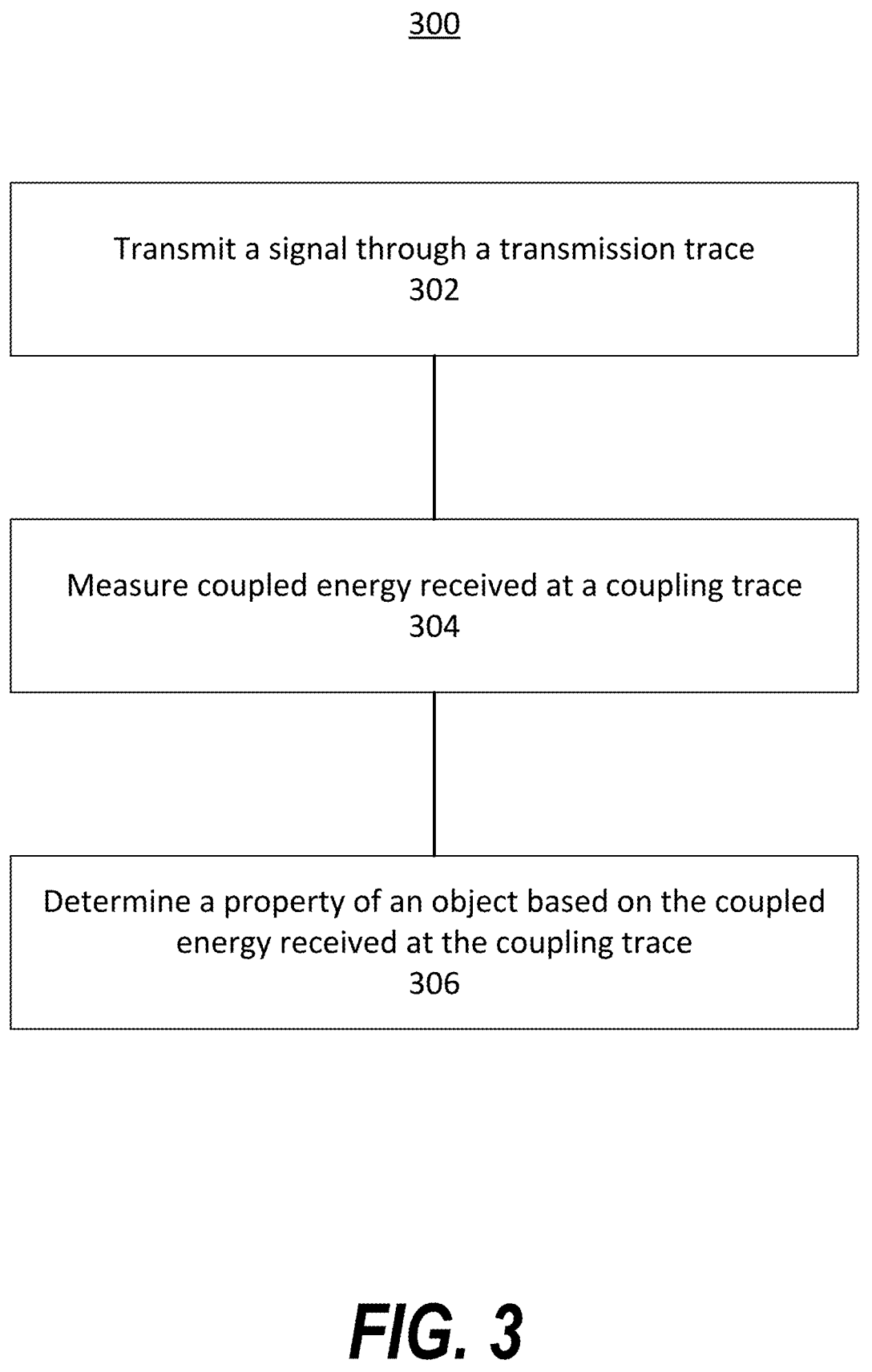

300

Transmit a signal through a transmission trace
302

Measure coupled energy received at a coupling trace
304

Determine a property of an object based on the coupled
energy received at the coupling trace
306

*FIG. 3*

630   Single Pixel Measurement

640

642

630   Object over Multiple Pixels

650

652

EMBEDDED SENSORS

CROSS-REFERENCE TO RELATED APPLICATIONS

This application claims the benefit of U.S. provisional patent application No. 63/436,199, filed on Dec. 30, 2022, and titled "EMBEDDED SENSORS," the disclosure of which is expressly incorporated herein by reference in its entirety.

BACKGROUND

The position and/or orientation of a person can be useful information for a variety of purposes. For example, in nursing and healthcare settings, the position and/or orientation of an individual can relate to the safety of that individual. However, embedded sensors can be limited by cost, size, and accuracy considerations. Therefore, there is a need for improved embedded sensors.

SUMMARY

Methods and systems for embedded sensors are disclosed herein.

In some aspects, the techniques described herein relate to an embedded sensor including: a plurality of transmission traces; a plurality of coupling traces; and a plurality of fringing field regions formed by adjacent transmission traces and coupling traces.

In some aspects, the techniques described herein relate to an embedded sensor, wherein the plurality of transmission traces each include a plurality of plates.

In some aspects, the techniques described herein relate to an embedded sensor, wherein the plurality of coupling traces each include a plurality of plates.

In some aspects, the techniques described herein relate to an embedded sensor, wherein the plurality of transmission traces are positioned orthogonally to the plurality of coupling traces.

In some aspects, the techniques described herein relate to an embedded sensor, wherein the fringing field regions form a rectangular array.

In some aspects, the techniques described herein relate to an embedded sensor, further including a first switch operably coupled to the plurality of transmission traces and a second switch operably coupled to the plurality of coupling traces, wherein the switch is configured to select one of the plurality of coupling traces and one of the plurality of transmission traces.

In some aspects, the techniques described herein relate to an embedded sensor, further including a processor operably coupled to the first switch and the second switch, and configured to: select a transmission trace and a coupling traces from the plurality of transmission traces and coupling traces; measure a capacitance between the transmission trace and the coupling trace.

In some aspects, the techniques described herein relate to a method including: transmitting a signal through a transmission trace; measuring capacitance at a coupling trace, wherein the coupling trace is electrically coupled to the transmission trace; and determining a property of an object based on the capacitance.

In some aspects, the techniques described herein relate to a method, further including transmitting a second signal through a second transmission trace and measuring an electrical coupling value between the transmission trace and the second transmission trace.

In some aspects, the techniques described herein relate to a method, further including transmitting signals through a plurality of transmission traces and a measuring capacitance at a plurality of coupling traces.

In some aspects, the techniques described herein relate to a method, further including using a switch to switch between the plurality of transmission traces.

In some aspects, the techniques described herein relate to a method, further including using a switch to switch between a plurality of coupling traces.

In some aspects, the techniques described herein relate to a method, wherein the property of the object is a presence, size, distance, material property or location of the object.

In some aspects, the techniques described herein relate to a system including: an embedded sensor including: a plurality of transmission traces; a plurality of coupling traces; and a plurality of fringing field regions formed by adjacent transmission traces and coupling traces. a computing device operably coupled to the embedded sensor, wherein the computing device includes at least one processor and memory, the memory having computer-executable instructions stored thereon that, when executed by the at least one processor, cause the at least one processor to: transmit a signal through a transmission trace; measure a capacitance at a coupling trace, wherein the coupling trace is electrically coupled to the transmission trace; determine a property of an object based on the capacitance; and output the property of the object.

In some aspects, the techniques described herein relate to a system, wherein the property of the object is a presence, size, distance, material property or location of the object.

In some aspects, the techniques described herein relate to a system, further including a portable electronic device operably coupled to the computing device, wherein the portable electronic device is configured to: receive the property of the object.

In some aspects, the techniques described herein relate to a system, wherein the portable electronic device is configured to display the property of the object on a graphical user interface (GUI).

In some aspects, the techniques described herein relate to a system, wherein the portable electronic device is further configured to: output an alarm based on the property of the object.

In some aspects, the techniques described herein relate to a system, wherein the embedded sensor further includes a plurality of transmission traces and a plurality of coupling traces, and a switch operably coupled to the plurality of coupling traces and configured to select a coupling trace from the plurality of coupling traces.

In some aspects, the techniques described herein relate to a system, wherein the embedded sensor further includes a plurality of transmission traces and a plurality of coupling traces, and wherein the computing device is further configured to measure a plurality of capacitances of the plurality of transmission traces and the plurality of coupling traces, and wherein the property of the object is based on the plurality of capacitances.

BRIEF DESCRIPTION OF THE DRAWINGS

The components in the drawings are not necessarily to scale relative to each other. Like reference numerals designate corresponding parts throughout the several views.

FIG. 3 illustrates an example method of sensing using an embedded sensor.

DETAILED DESCRIPTION

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint. While implementations will be described for measuring the position of an infant using sensors embedded in textiles, it will become evident to those skilled in the art that the implementations are not limited thereto, but are applicable for any other type of sensing using embedded sensors. This may include, but is not limited to, a consumer device such as a garment including embedded sensors for measuring proximity, body position, contact, etc, or measuring the position, orientation, contact, and proximity of/between any other objects.

Described herein are systems and methods for embedded sensors. As used herein, "embedded sensors" refers to sensors that can be configured to be placed in/on other objects. For example, sensors that can be incorporated into a garment or other textile.

Figure 1:
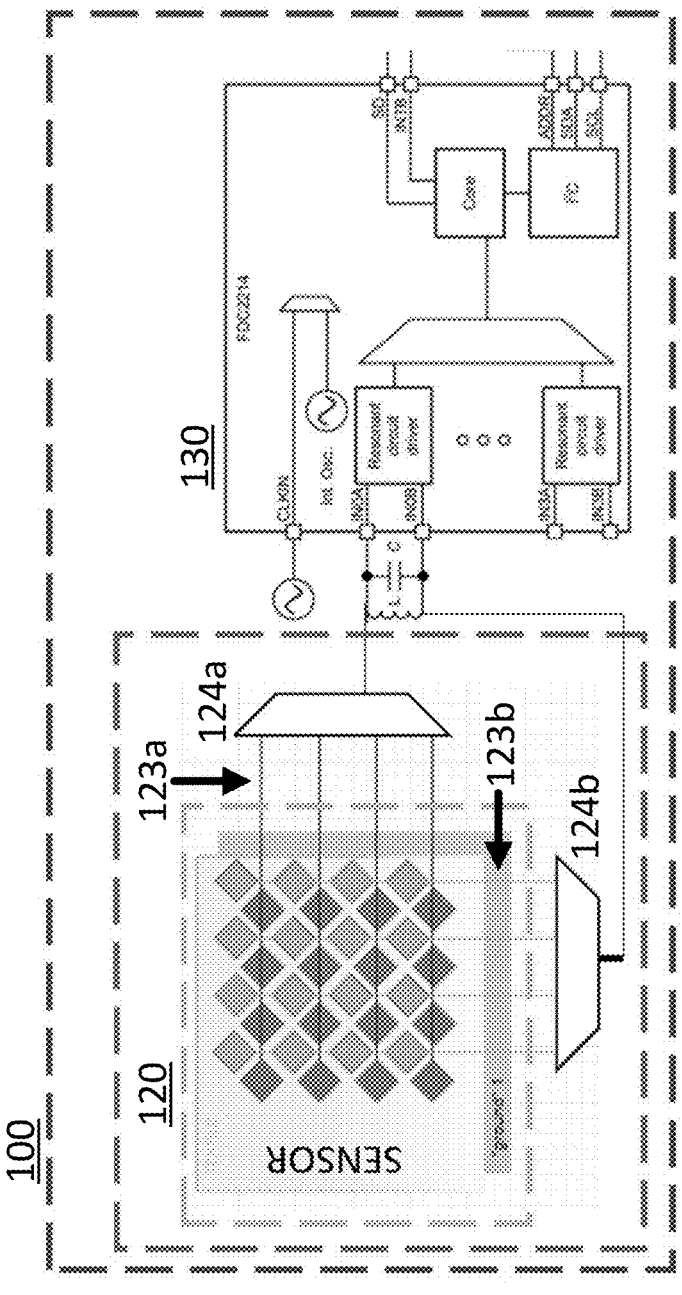
FIG. 1 illustrates an example system including an embedded sensor.

With reference to FIG. 1, an example system 100 including an embedded sensor 120 is shown. The system 100 can include a computing device 130 configured to receive information from the sensor 120. The computing device 130 can include any/all of the features of the computing device 400 illustrated and described herein with respect to FIG. 4. In the implementation of the present disclosure shown in FIG. 1, the computing device 130 can optionally include a circuit to measure or detect electrical coupling. Optionally, the circuit for measuring or detecting electrical coupling can output an analog and/or digital signal based on the measured or detected electrical coupling.

As used herein, "coupling" refers to the interaction of an electromagnetic magnetic field transmitted from one element (e.g., a wire or trace) interacts with another element (e.g., another wire or trace). Coupling can include conduction (current flows between the elements), radiation (the coupled elements are separated by distance), capacitive coupling (capacitances between nearby circuit elements), and inductive coupling (currents produced when one circuit element is in an electromagnetic field produced by another circuit element).

The computing device 130 shown in FIG. 1 can optionally include a circuit configured to measure electromagnetic coupling. As shown in FIG. 1, the computing device 130 can include a capacitance-to-digital converter. A non-limiting example of a capacitance-to-digital converter is sold under the trademark FDC2214 by Texas Instruments. The FDC2214 can optionally measure reactive load based on small frequency detuning of a resonant LC circuit. It should be understood that in other implementations of the present disclosure, the computing device 130 could include an inductance-to-digital converter. A non-limiting example of an inductance to digital converter is sold under the trademark LDC2214 by Texas instruments. Again, it should be understood that these are intended only as non-limiting examples, and that other implementations of the present disclosure can include any circuits configured to measure electromagnetic coupling. It should further be understood that any of the various circuits and devices for measuring coupling described herein can be operably connected to the switches 124a, 124b to take single or multichannel measurements of properties including reactive load, inductance, and capacitance.

The system 100 can further include switches 124a 124b that can be operably connected to the computing device 130 and controlled by the computing device 130. The switches 124a, 124b can be operably coupled to the sensor 120. Optionally sensor 120 can include the sensor arrays 230 shown in FIGS. 2C and/or 2D. The switches 124a 124b can be configured so that the computing device 130 can measure a parameter (e.g., coupling) at specific locations on the sensor 120. As shown in FIG. 1, switch 124a can operably connect traces 123a to the computing device 130, and switch 124b can operably connect trace 123b to the computing device 130. The traces 123a, 123b can be either transmission traces or coupling traces, according to implementations of the present disclosure. An example configuration of transmission and coupling traces is described herein with respect to FIG. 2B.

In some implementations of the present disclosure, the computing device 130 is configured to operate at the megahertz (MHz) spectrum. Implementations of the present disclosure that operate at the megahertz spectrum can avoid the need for a vector network analyzer.

Figure 2B:
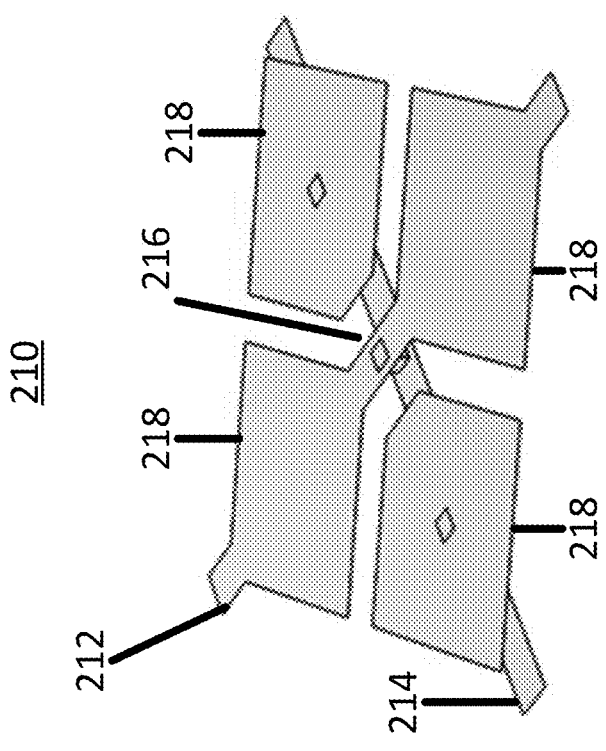
FIG. 2B illustrates an example cell of an embedded sensor.
Figure 2A:
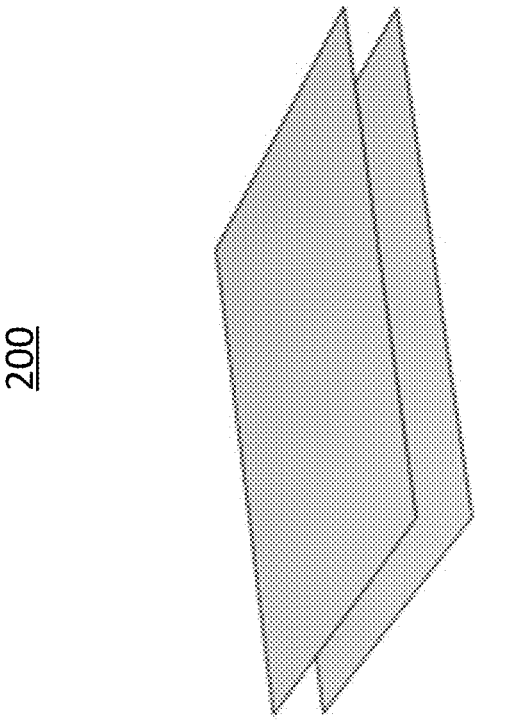
FIG. 2A illustrates an example calibration reference for an embedded sensor.

With reference to FIGS. 2A-2D, example components that can be used in the sensor 120 illustrated in FIG. 1 are shown. FIG. 2A illustrates a calibration reference 200 that can be used in fabricating and/or simulating implementations of the present disclosure.

FIG. 2B illustrates an example sensor cell 210. The sensor cell 210 can include a transmission trace 212 and a coupling trace 214. A fringing field (also referred to herein as a "fringing field region") can be present at the intersection 216 of the transmission trace 212 and the coupling trace 214. As used herein, it should be understood that the "intersection" between the transmission trace 212 and coupling trace 214 is where the transmission trace 212 and coupling trace 214 are adjacent, but not connected for direct current conduction between the transmission trace 212 and coupling trace 214. Therefore, in some implementations, the adjacent transmission trace 212 and coupling trace 214 can be not physically touching each other. Optionally, the transmission trace 212 and/or coupling trace 214 can include plates 218 either connected to the transmission trace 212 and/or coupling trace 214, or formed in the transmission trace 212 and/or coupling trace 214. In the example shown in FIG. 2B, the transmission trace 212 and coupling trace 214 are shown as orthogonal to one another, in other implementations of the present disclosure the transmission trace 212 and coupling trace 214 can form any angle.

Figure 2C:
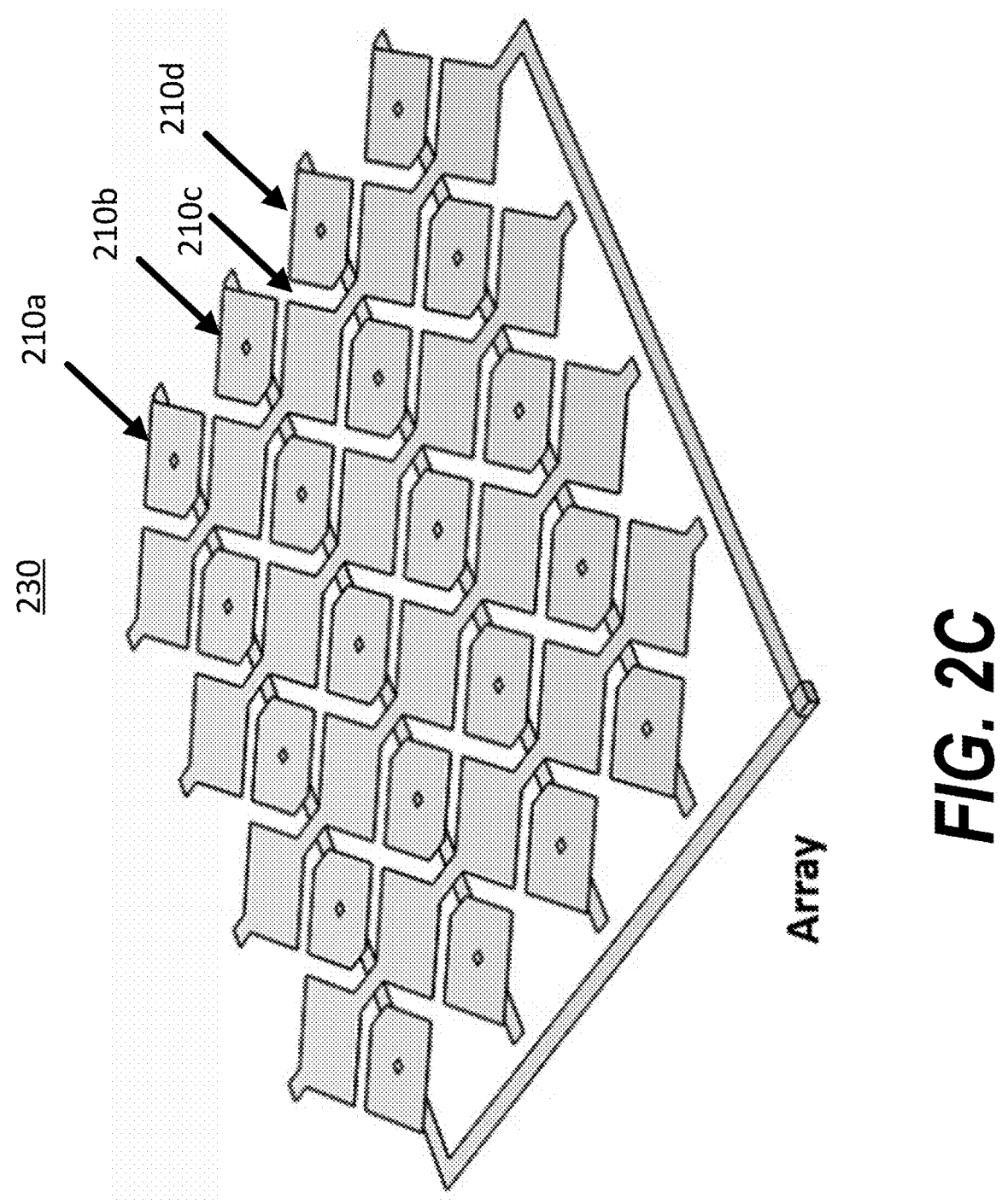
FIG. 2C illustrates an example array of cells for an embedded sensor

FIG. 2C illustrates an example sensor array 230 of (e.g., the cells 210 shown in FIG. 2B) for an embedded sensor (e.g., the sensor 120 shown in FIG. 1). Four example cells 210a, 210b, 210c, 210d are labeled in FIG. 2C, but implementations of the present disclosure include arrays 230 including any number of cells, in different shapes and sizes. The array 230 of cells 210 in FIG. 2C is a square array, but it should be understood that the cells 210 can be arranged in any shape (e.g., rectangles, other polygons, straight lines, curves, etc.)

Figure 2D:
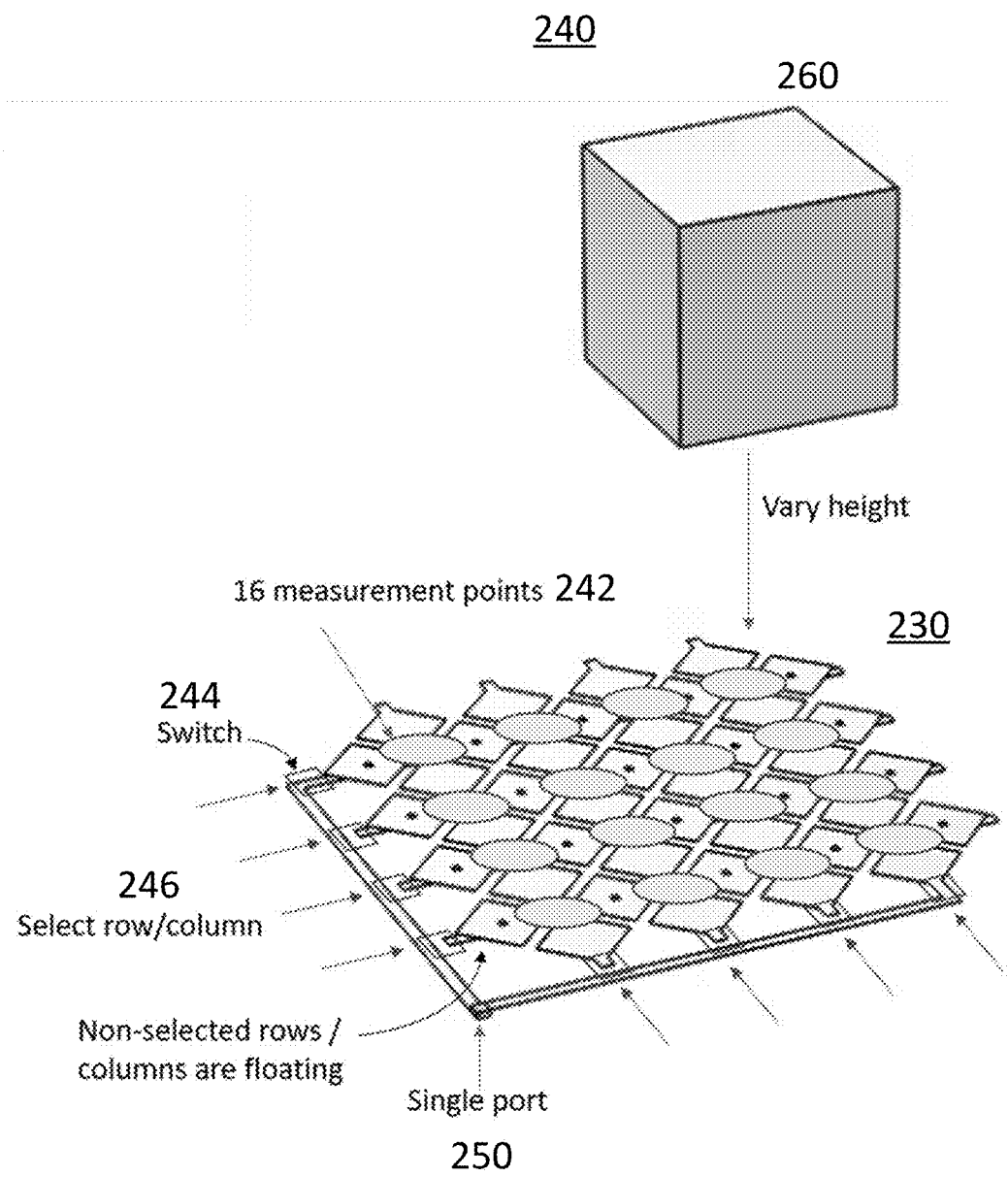
FIG. 2D illustrates a simulation based on the example calibration references, cells, and array illustrated in FIGS. 2A-2C.

FIG. 2D illustrates a simulation 240 of the example sensor array 230 and sensor cells 210 illustrated in FIGS. 2B-2C. The sensor array 230 shown in FIG. 2D includes 16 measurement points 242 that can correspond to the 16 sensor cells 210 illustrated in FIG. 2C. The cells 210 corresponding to the 16 measurement points 242 can be operably connected to a switch 244. The switch 244 can select rows/columns 246 from the sensor array 230 to measure a value (e.g., a coupling value) present at the respective row/column 246. The simulation 240 can include an object 260 positioned relative to the sensor array 230. Optionally, implementations of the present disclosure can be configured without a ground plane, which can improve sensitivity and/or accuracy. Implementations of the present disclosure can be configured for use in wearable devices (e.g., blankets, bedding, and/or clothing), where fabric and cloth that the wearable devices is made of is mostly air by volume, and therefore significantly less conductive when compared to an electrical ground plane.

In some implementations of the present disclosure, the rows/columns 246 can be operably coupled to a single port 250 (e.g., using the switch 244). As described with reference to FIG. 1, the single port 250 and switch 244 can be operable coupled to a computing device (shown as 130 in FIG. 1) to read the sensor by selecting different rows/columns 246 to read in sequence.

In a non-limiting example implementation, the rows/columns 246 are spaced by 14 mm, which can result in a sensor with a 14 mm resolution. However, it should be understood that the rows/columns 246 can be spaced by different amounts, which can allow the sensor to have different sensor resolutions.

In another non-limiting example implementation, the sensor array 230 shown in FIGS. 2C-2D can include 100 cells (e.g., a 10×10 grid of cells). It should be understood that any number of cells 210 can be used in sensor arrays 230 according to various embodiments of the present disclosure.

With reference to FIG. 3, an example method 300 for sensing using the embedded sensors described with reference to FIGS. 1-2D and 6-8 is shown. The method can include transmitting a signal through a transmission trace at step 302. Optionally, the signal transmitted at step 302 can be simultaneously transmitted through any number of transmission traces (i.e. in parallel) or sequentially transmitted through any number of transmission traces (i.e., in serial). Transmitting the signal through the transmission trace can be performed by using a switch to select a particular transmission trace or particular transmission traces from the transmission traces.

The method 300 can further include measuring capacitance at a coupling trace at step 304. As described herein, the coupling trace can be electrically coupled to the transmission trace. The capacitance between the coupling trace and transmission trace can be affected by an object that is in proximity to the coupling trace and/or transmission trace. Any number of coupling traces can be used, and the measurement of the capacitance at the coupling traces can be performed simultaneously (i.e., in parallel) or sequentially (i.e., in serial). Additionally, any number of coupling traces can be connected using any number of switches, and the method can include switching between the coupling traces to measure capacitance at any of the coupling traces.

Alternatively or additionally, in some implementations of the present disclosure, step 304 can include measuring an inductance at a coupling trace. The inductance at the coupling trace can be affected by objects in proximity to the coupling trace and/or transmission trace, and any number of coupling and transmission traces can be used.

At step 306, the method can further include determining the location of an object based on the measured capacitance. Optionally, measuring the capacitance can be performed by measuring a capacitance from an s11 phase angle (e.g., using the transmission trace and coupling trace). The capacitance can be affected by the proximity of the traces to an object or person. Again, alternatively or additionally, in some implementations of the present disclosure, the location of the object can be determined using the measured inductance, if inductance is measured at step 304.

In some implementations of the present disclosure, the method can further include repeating the steps of the method 300 illustrated in FIG. 3. The method 300 can be repeated using different combinations of coupling and transmission traces, or using the same coupling and transmission traces. For example, the method 300 can include switching between transmission and coupling traces. When the method 300 illustrated in FIG. 3 is repeated, measurements from each repetition of the method 300 can be stored (for example, in the computing device described in FIG. 4). The stored measurements over time can be used to determine properties of the object or monitor changes in an object over time. Non-limiting examples of properties that can be determined or monitored using repeated measurements include the presence, size, distance, material property or location of an object.

Example 1

Figure 5B:
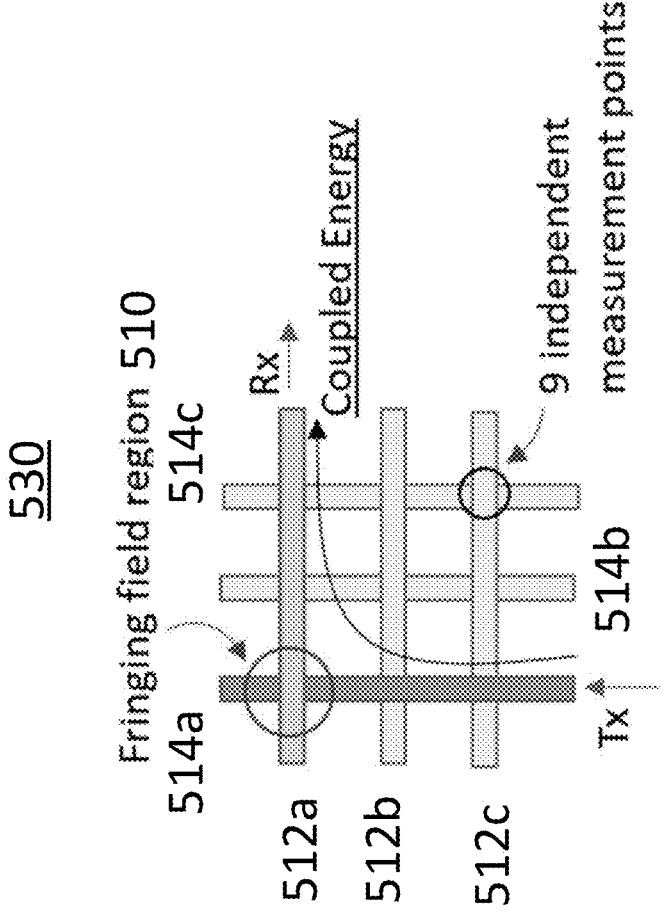
FIG. 5B illustrates fringing fields and coupled energy, according to implementations of the present disclosure.
Figure 5A:
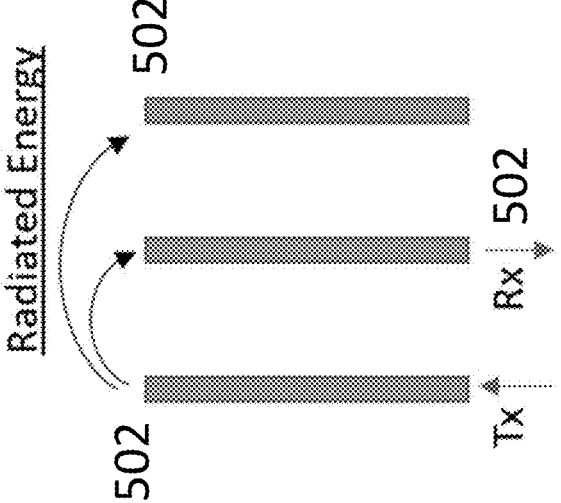
FIG. 5A illustrates radiated energy between adjacent traces.

Implementations of the present disclosure improve sensing technology by sensing internally coupled energy. FIG. 5A illustrates an example of radiated energy between traces 502.

Implementations of the present disclosure include sensors that operate by sensing internally coupled energy between adjacent traces. The coupling between orthogonal traces in a sensor can be dominated by the point where the traces are closest (i.e., the "intersection" or "fringing field region") of the traces. FIG. 5B illustrates a fringing field region 510 between two traces 512a, 514a where traces 512a, 514a are orthogonal. Because the grid 530 shown in FIG. 5B has three traces 512a, 512b, 512c that are orthogonal to three other traces 514a, 514b, 514c, the grid 530 shown in FIG. 5B includes nine total intersection points.

The grid 530 can therefore measure contact or proximity with the fringing field region 510 without using an antenna. The grid 530 can operate at low frequencies, and in some implementations of the present disclosure does not require T-lines. Optionally, the grid 530 can be fabricated at a centimeter scale for high resolution, and the resolution of the sensor increases with the square of the number of traces on each side of the grid (e.g., five traces on each side can be used to create 25 total fringing field regions for measurement).

Figures 6A, 6B:
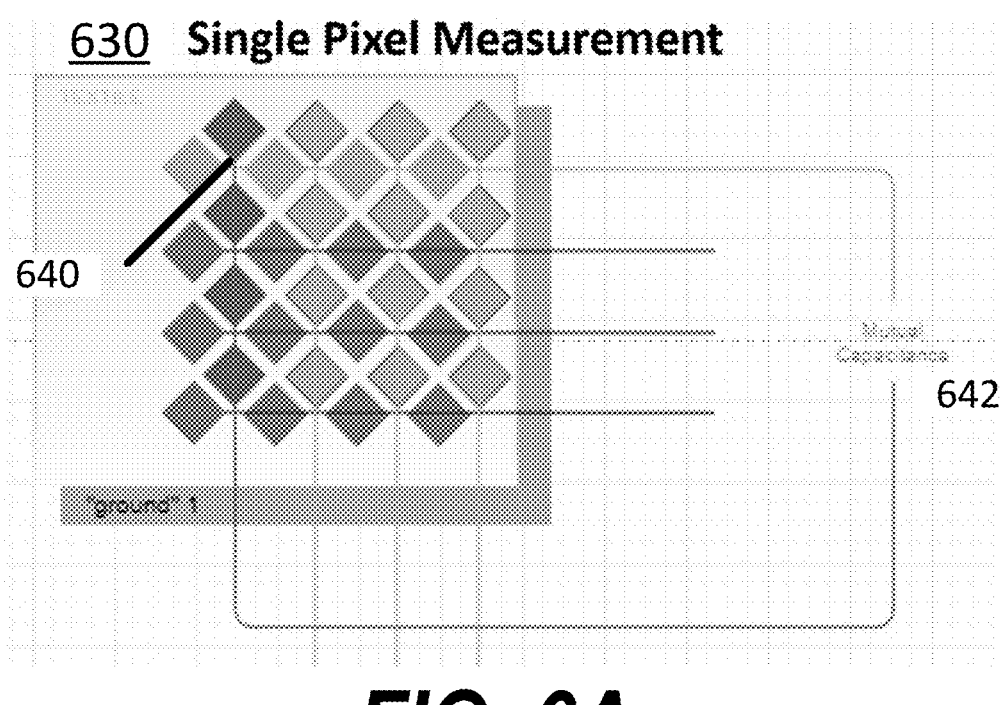
FIG. 6A illustrates a single pixel measurement using a sensor array according to implementations of the present disclosure.
FIG. 6B illustrates multiple pixel measurement using a sensor array according to implementations of the present disclosure.

Implementations of the present disclosure can be configured to measure or detect objects of different sizes. FIG. 6A illustrates an example of a grid 630 configured to measure a point 640. A mutual capacitance 642 can be measured at the point 640 to measure or detect a contact or proximity near the point 640. Again, it should be understood that in some implementations of the present disclosure a mutual inductance could be measured at the point 640 to detect a contact or proximity near the point 640.

FIG. 6B illustrates an example implementation of the present disclosure including traces r1, r2, r3, r4 and traces c1, c2, c3, c4 in grid 630. The example implementation is configured to measure the area 650 of an object. A set of mutual capacitances 652 can be measured between the traces in the area 650 where the object is positioned. In the example shown in FIG. 6B, the capacitance of the following traces are in the area 650, and therefore the area of the object can be measured by detecting the change in capacitance of the following pairs of traces: r1 and c1, r1 and c2, r1 and c3, r2 and c1, r2 and c2, r2 and c3. Because the location of the traces in the grid 630 can be known, the area can be calculated using the known distances between the traces. For example, the computing devices described with respect to various implementations of the present disclosure (e.g., computing device 400 shown in FIG. 4), can store the location of one or more traces. It should be understood that measuring the area 650 of the object can also include determining a shape or size of the object based on the change in capacitance (or inductance) of traces in the area 650.

Again, it should be understood that in some implementations of the present disclosure a plurality of mutual inductances could be measured at the area 650 to detect a contact or proximity near the area 650, or to measure the size, area, and/or shape of an object.

Figure 7:
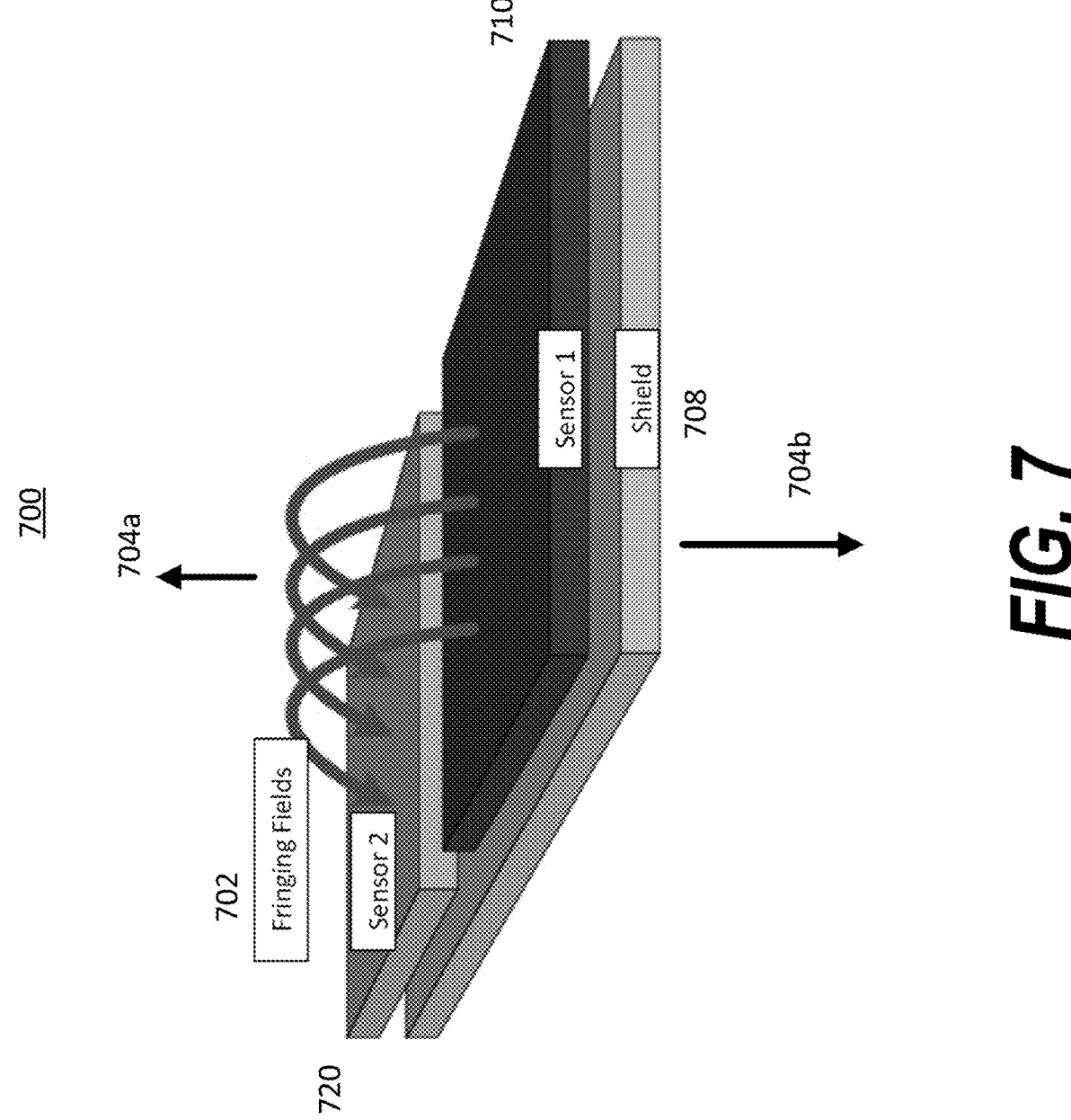
FIG. 7 illustrates fringing fields between two sensors including a shield, according to implementations of the present disclosure.

FIG. 7 illustrates an embedded sensor 700 according to an example implementation of the present disclosure. The embedded sensor 700 includes a first sensor 710 and a second sensor 720. The first sensor 710 and second sensor 720 are illustrated as square pads, but it should be understood that any shape can be used for the first sensor 710 and/or second sensor 720 and that the first sensor 710 and second sensor 720 can optionally be different shapes and/or sizes.

The fringing field 702 between the first sensor 710 and second sensor 720 is also shown. The fringing field 702 can interact with any object (not shown) that enters the fringing field 702 As used herein, "interacts with" can optionally refer to a change in coupling without a change in total energy coupled.

As shown in FIG. 7, the embedded sensor 700 can optionally include a shield 708 that blocks energy radiation. In the implementation shown in FIG. 7, the embedded sensor includes a first side 704a and a second side 704b. The shield 708 is positioned on the second side 704b of the embedded sensor 700 so that the fringing field 702 is formed on the first side 704a of the embedded sensor 700. It should be understood that the position of the fringing field shown in FIG. 7 is intended only as a non-limiting example and that in some implementations of the present disclosure the shield 708 can be positioned on the first side 704a so that the fringing field 702 is formed on the second side 704b of the embedded sensor 700. It should also be understood that in some implementations of the present disclosure multiple shields can be used, for example a first shield can be positioned on a first portion of the first side 704a and a second shield can be positioned on a second portion of the first side 704a. Alternatively or additionally, a first shield can be positioned on a portion of the first side 704a and a second shield can be positioned on a portion of the second side 704b of the sensor.

It should be understood that the embedded sensor 700 can include any number of sensors 710,720. In some implementations of the present disclosure, the size and/or spacing of the sensor pads 710,720 can be varied to increase the resolution of the sensor. Additionally, it should be understood that implementations of the present disclosure can include a shield 708. As a non-limiting example, the sensor array 230 described in FIG. 2C can optionally include a shield positioned adjacent to the sensor array 230.

Figure 8:
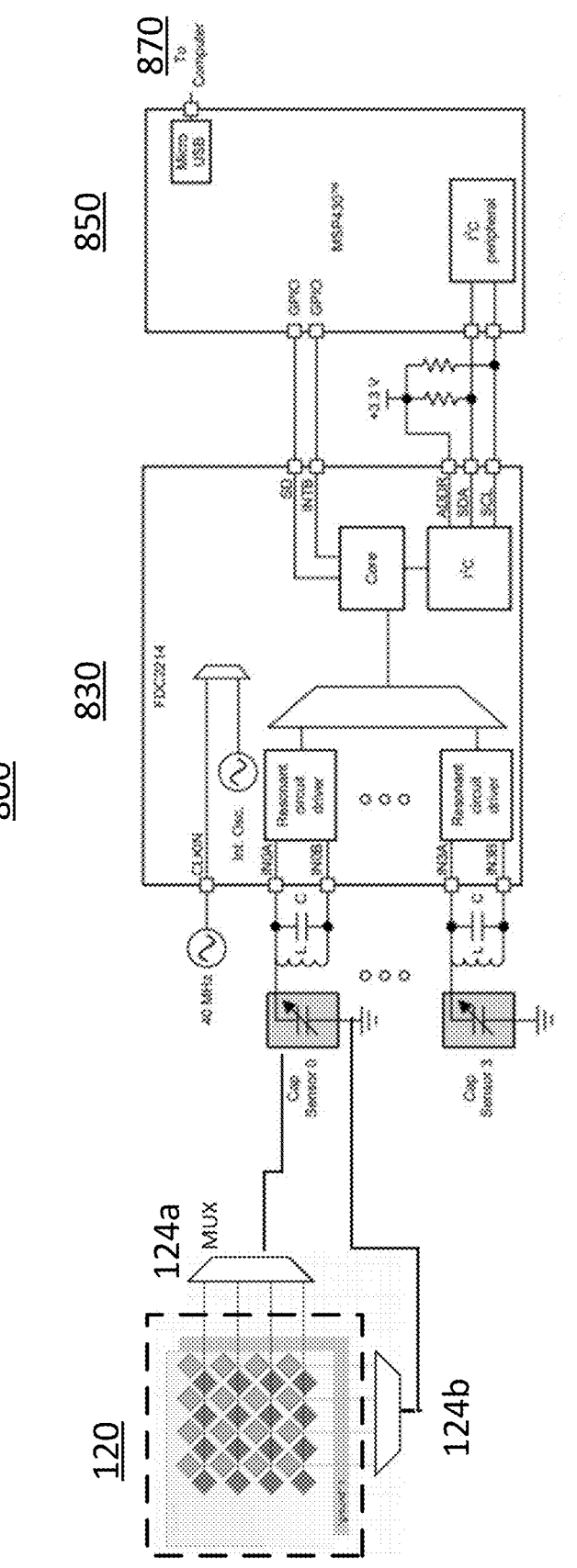
FIG. 8 illustrates an example system including an embedded sensor, according to implementations of the present disclosure.

FIG. 8 illustrates a system 800 according to an implementation of the present disclosure. The system 800 includes a capacitance to digital converter 830 operably coupled to a computing device 850. The capacitance to digital converter 830 and/or computing device 850 can include any of the components of the computing device 400 shown in FIG. 4. The capacitance to digital converter 830 can be operably coupled to a first switch 124a and a second switch 124b, and the first switch 124a and second switch 124b can be operably coupled to the sensor 120. The sensor 120 shown in FIG. 8 can include any of the sensor arrays 230 described with reference to FIGS. 2C and 2D.

The computing device 850 can be operationally coupled to a second computing device 870, for example using a wired or wireless network, as described with reference to network connections 416 shown in FIG. 4. Optionally, the second computing device 870 can include any of the elements described with reference to the computing device 400 shown in FIG. 4. In some implementations of the present disclosure, the second computing device 870 can be a computing device configured as a portable electronic device, as a cloud server, and/or as a wearable device (e.g., smart watch). The computing device 850 can optionally be configured to transmit measurements from the sensor to the second computing device 870, and the second computing device 870 can optionally be configured to output the measurements for display. Optionally, the measurements can include any property of an object measured by the sensor 120 described herein, including the presence, size, distance, material property or location of the object.

In some implementations of the present disclosure, the second computing device 870 can be configured to output properties of the object on a graphical user interface (GUI). For example, if the second computing device 870 is a wearable device, the properties of the object can be displayed on a screen of the wearable device (not shown).

In some implementations of the present disclosure, the second computing device 870 can be configured to output an alarm based on the properties of the object. As non-limiting examples, the alarm can be output by detecting a contact with the sensor 120, a loss of contact with the sensor 120, an object in proximity to the sensor 120, a loss or lack of an object in proximity to the sensor 120, identifying a shape or change in shape of an object sensed by the sensor 120, identifying an area or a change in area of the object sensed by the sensor 120.

In some implementations of the present disclosure, the second computing device 870 can be configured to sense multiple capacitances using the sensor 120. The multiple capacitances can correspond to different physical locations on a sensor array 230, for example the measurement points 242 illustrated in FIG. 2D. The computing device 850 can optionally be configured to use the multiple capacitances measured by the sensor 120 at different measurement points 242 to determine a property of an object. As non-limiting examples the area of an object, a length of an object, and/or a shape of an object can be measured by recording capacitances using the sensor 120 at different measurement points, detecting proximity or contact to the measurement points of the sensor 120 based on the multiple capacitances, and estimating the number of measurement points that are in contact with and/or in proximity with the object.

Example 2

Figure 9:
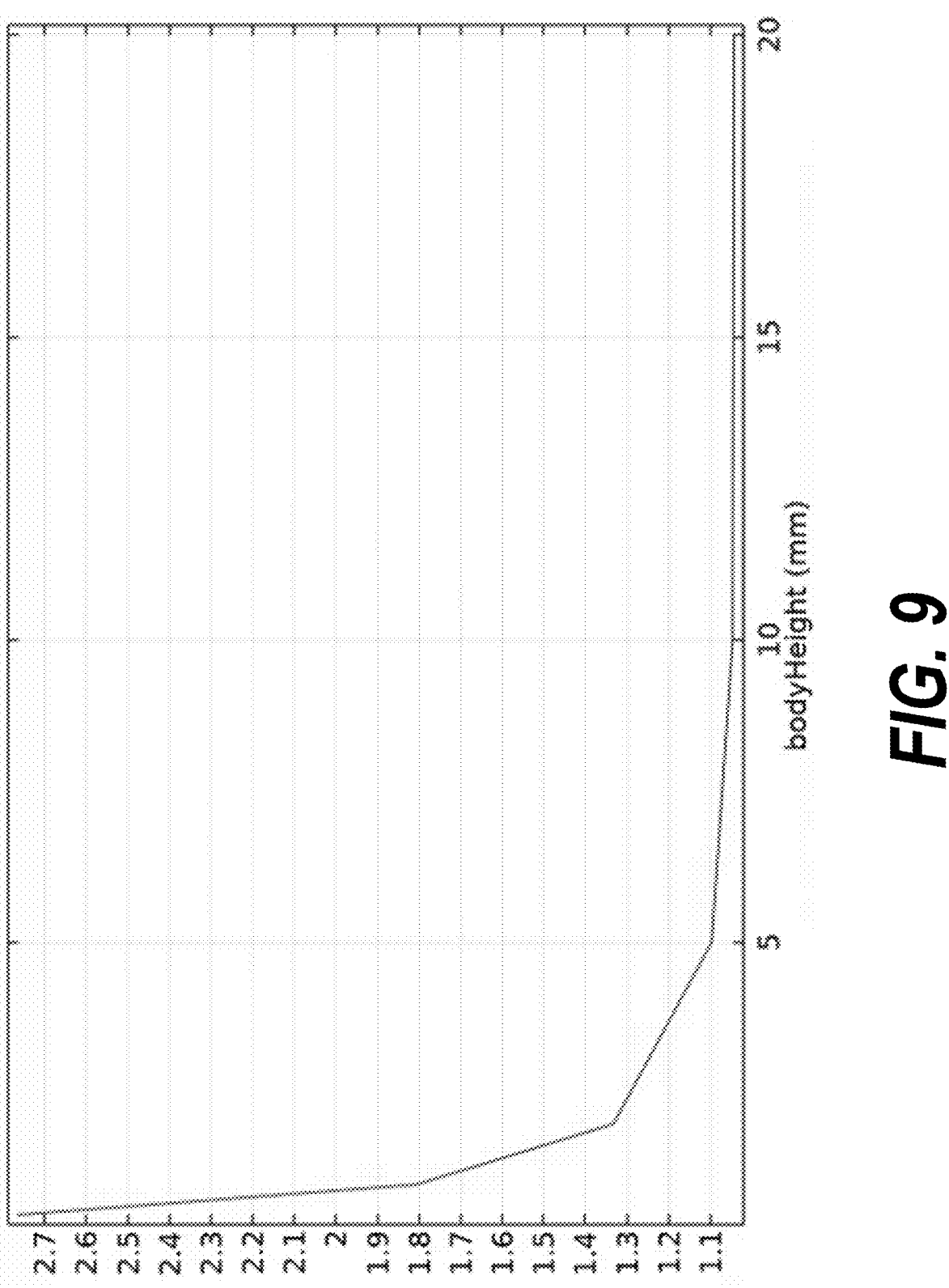
FIG. 9 illustrates a plot of capacitance vs body height, according to a study performed using an example implementation of the present disclosure.

The implementation of the present disclosure illustrated in FIGS. 1-2D was designed and tested. FIG. 9 illustrates a plot of capacitance (pF) extracted from S11 phase angle vs body height in millimeters. The simulation results shown in FIG. 9 indicate a measurable increase (1-3 pF) in capacitance at intersection point when body is near ($\approx$2 mm).

The results in the study shown in FIG. 9 were consistent with single or arrayed cells and show that implementations of the present disclosure can be capable of fF (femtofarad) resolution.

Figure 10:
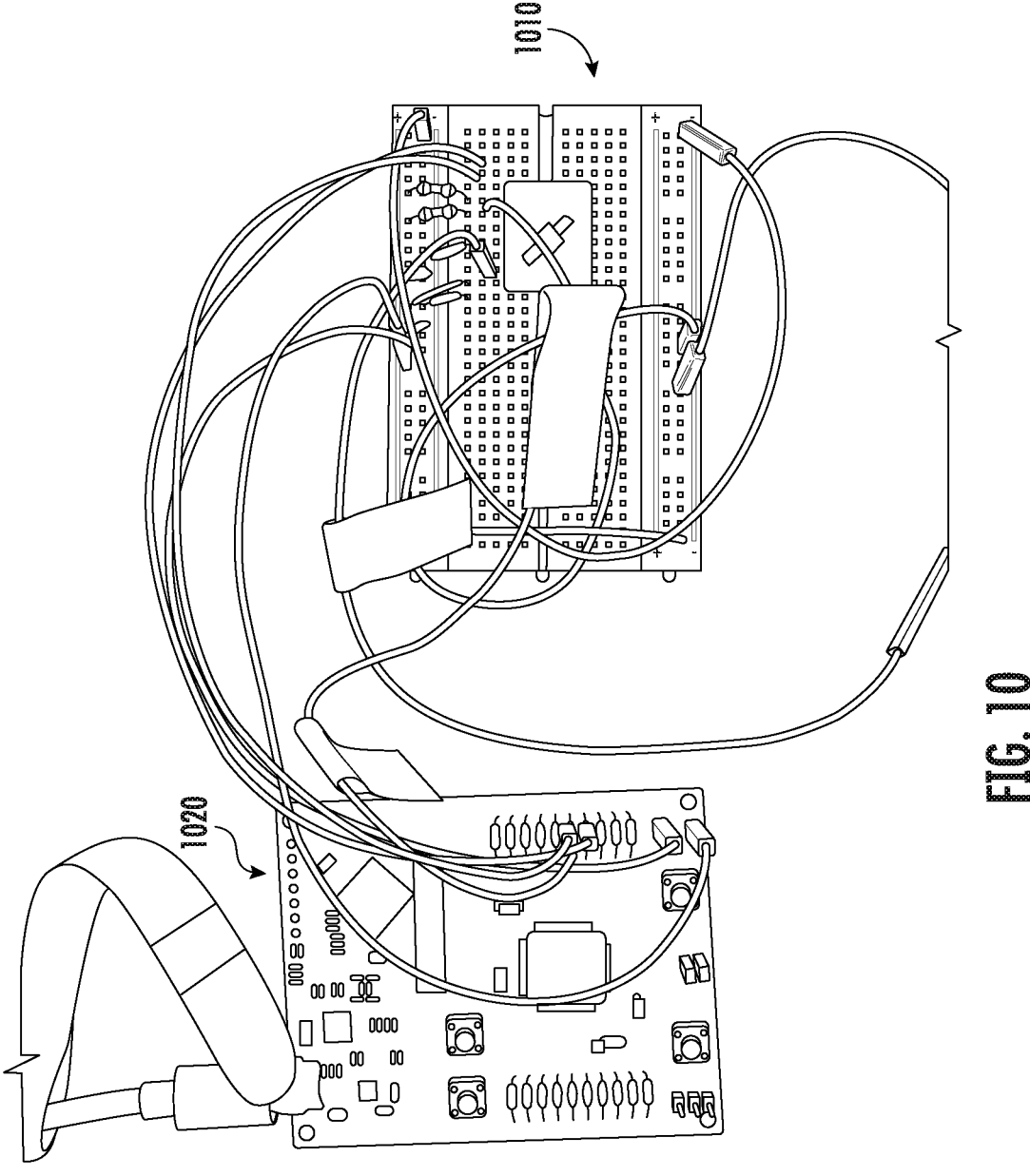
FIG. 10 illustrates an example implementation of the present disclosure including a high precision capacitance to digital converter and microprocessor.

FIG. 10 illustrates a study of an example implementation of the present disclosure. The example implementation includes a high-precision capacitance-to-digital converter 1010. The example high-precision capacitance-to-digital converter 1010 includes 4 channels with a shutdown current of 200 nA and includes an i2C interface. In the example shown in FIG. 10, the high-precision capacitance-to-digital converter 1010 is an FDC2214 sold under the trademark Texas Instruments, but it should be understood that the high-precision capacitance-to-digital converter 1010 described herein is intended only as a non-limiting example, and that other circuits can be used to convert measured capacitances to digital and/or analog signals according to various implementations of the present disclosure. In an alternative implementation of the present disclosure, a high-precision inductance-to-digital converter can be used in addition to, or in place of the high-precision capacitance-to-digital converter 1010.

In some implementations of the present disclosure, multiple high-precision capacitance-to-digital converters 1010 can be used to measure multiple capacitances simultaneously. Alternatively or additionally, multiple high-precision inductance-to-digital converters can be used to measure multiple inductances simultaneously. The present disclosure further contemplates that the systems described herein can include combinations of any number of inductance-to-digital and capacitance-to-digital converters.

Still with reference to FIG. 10, the example implementation includes a microprocessor 1020. In the example shown in FIG. 10, the microprocessor 1020 is a MSP430 Ultra Low Power MCU (F5529) sold under the trademark Texas Instruments, but it should be understood that different microprocessors can be used in various implementations of the present disclosure and that the microprocessor 1020 can include any or all of the components of the computing device 400 shown in FIG. 4.

It should be appreciated that the logical operations described herein with respect to the various figures may be implemented (1) as a sequence of computer implemented acts or program modules (i.e., software) running on a computing device (e.g., the computing device described in FIG. 4), (2) as interconnected machine logic circuits or circuit modules (i.e., hardware) within the computing device and/or (3) a combination of software and hardware of the computing device. Thus, the logical operations discussed herein are not limited to any specific combination of hardware and software. The implementation is a matter of choice dependent on the performance and other requirements of the computing device. Accordingly, the logical operations described herein are referred to variously as operations, structural devices, acts, or modules. These operations, structural devices, acts and modules may be implemented in software, in firmware, in special purpose digital logic, and any combination thereof. It should also be appreciated that more or fewer operations may be performed than shown in the figures and described herein. These operations may also be performed in a different order than those described herein.

Figure 4:
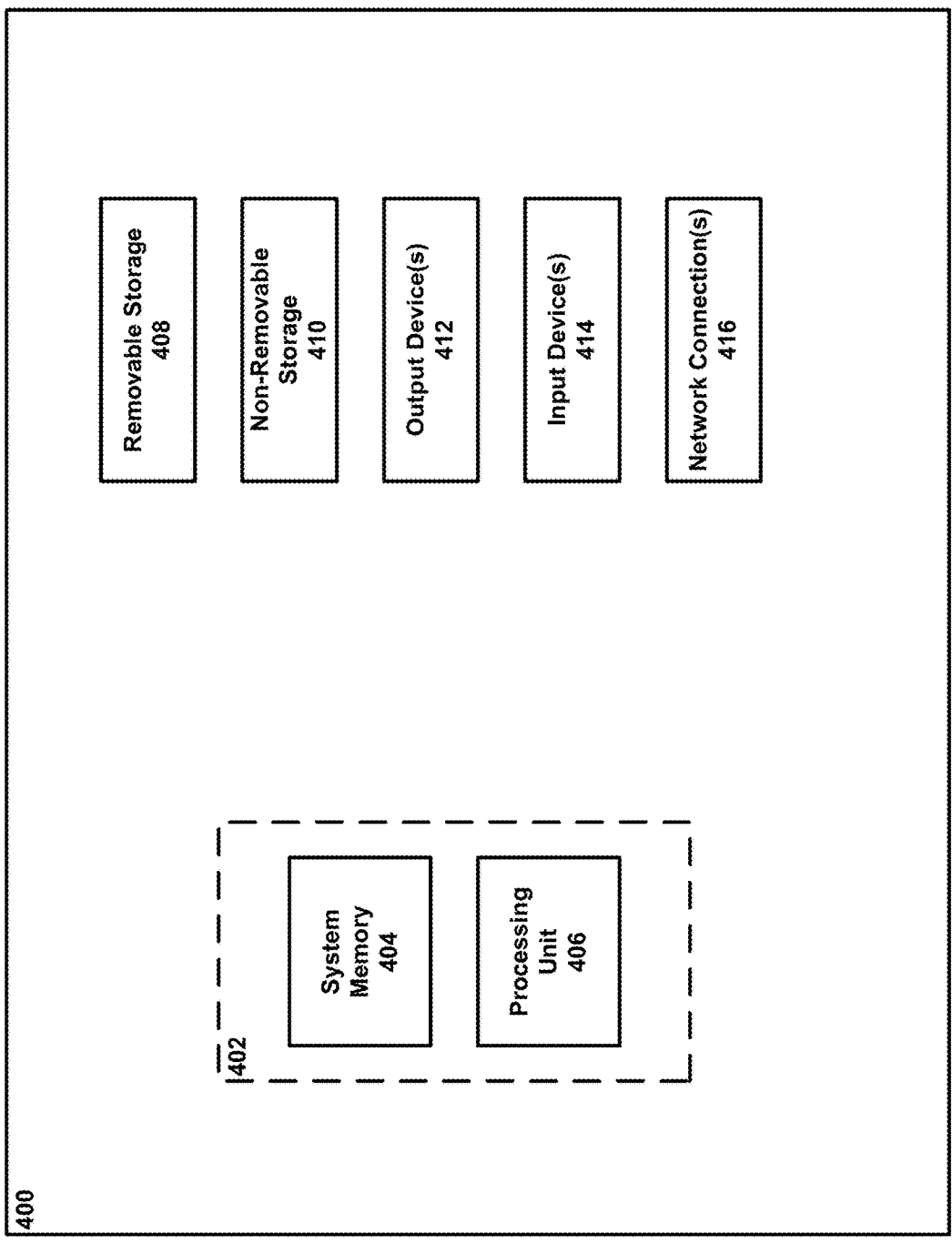
FIG. 4 is an example computing device.

Referring to FIG. 4, an example computing device 400 upon which the methods described herein may be implemented is illustrated. It should be understood that the example computing device 400 is only one example of a suitable computing environment upon which the methods described herein may be implemented. Optionally, the computing device 400 can be a well-known computing system including, but not limited to, personal computers, servers, handheld or laptop devices, multiprocessor systems, microprocessor-based systems, network personal computers (PCs), minicomputers, mainframe computers, embedded systems, and/or distributed computing environments including a plurality of any of the above systems or devices. Distributed computing environments enable remote computing devices, which are connected to a communication network or other data transmission medium, to perform various tasks. In the distributed computing environment, the program modules, applications, and other data may be stored on local and/or remote computer storage media.

In its most basic configuration, computing device 400 typically includes at least one processing unit 406 and system memory 404. Depending on the exact configuration and type of computing device, system memory 404 may be volatile (such as random access memory (RAM)), non-volatile (such as read-only memory (ROM), flash memory, etc.), or some combination of the two. This most basic configuration is illustrated in FIG. 4 by dashed line 402. The processing unit 406 may be a standard programmable processor that performs arithmetic and logic operations necessary for operation of the computing device 400. The computing device 400 may also include a bus or other communication mechanism for communicating information among various components of the computing device 400.

Computing device 400 may have additional features/functionality. For example, computing device 400 may include additional storage such as removable storage 408 and non-removable storage 410 including, but not limited to, magnetic or optical disks or tapes. Computing device 400 may also contain network connection(s) 416 that allow the device to communicate with other devices. Computing device 400 may also have input device(s) 414 such as a keyboard, mouse, touch screen, etc. Output device(s) 412 such as a display, speakers, printer, etc. may also be included. The additional devices may be connected to the bus in order to facilitate communication of data among the components of the computing device 400. All these devices are well known in the art and need not be discussed at length here.

The processing unit 406 may be configured to execute program code encoded in tangible, computer-readable media. Tangible, computer-readable media refers to any media that is capable of providing data that causes the computing device 400 (i.e., a machine) to operate in a particular fashion. Various computer-readable media may be utilized to provide instructions to the processing unit 406 for execution. Example tangible, computer-readable media may include, but is not limited to, volatile media, non-volatile media, removable media and non-removable media implemented in any method or technology for storage of information such as computer readable instructions, data structures, program modules or other data. System memory 404, removable storage 408, and non-removable storage 410 are all examples of tangible, computer storage media. Example tangible, computer-readable recording media include, but are not limited to, an integrated circuit (e.g., field-programmable gate array or application-specific IC), a hard disk, an optical disk, a magneto-optical disk, a floppy disk, a magnetic tape, a holographic storage medium, a solid-state device, RAM, ROM, electrically erasable program read-only memory (EEPROM), flash memory or other memory technology, CD-ROM, digital versatile disks (DVD) or other optical storage, magnetic cassettes, magnetic tape, magnetic disk storage or other magnetic storage devices.

In an example implementation, the processing unit 406 may execute program code stored in the system memory 404. For example, the bus may carry data to the system memory 404, from which the processing unit 406 receives and executes instructions. The data received by the system memory 404 may optionally be stored on the removable storage 408 or the non-removable storage 410 before or after execution by the processing unit 406.

It should be understood that the various techniques described herein may be implemented in connection with hardware or software or, where appropriate, with a combination thereof. Thus, the methods and apparatuses of the presently disclosed subject matter, or certain aspects or portions thereof, may take the form of program code (i.e., instructions) embodied in tangible media, such as floppy diskettes, CD-ROMs, hard drives, or any other machine-readable storage medium where, when the program code is loaded into and executed by a machine, such as a computing device, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an application programming interface (API), reusable controls, or the like. Such programs may be implemented in a high level procedural or object-oriented programming language to communicate with a computer system. However, the program(s) can be implemented in assembly or machine language, if desired. In any case, the language may be a compiled or interpreted language and it may be combined with hardware implementations.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. An embedded sensor disposed on a textile substrate comprising:
    a plurality of transmission traces disposed on the textile substrate;
    a plurality of coupling traces disposed on the textile substrate; and
    a plurality of fringing field regions formed by adjacent transmission traces and coupling traces, wherein the embedded sensor is configured to operate without a ground plane adjacent to the plurality of transmission traces and the plurality of coupling traces.

2. The embedded sensor of claim 1, wherein the plurality of transmission traces each comprise a plurality of plates.

3. The embedded sensor of claim 1, wherein the plurality of coupling traces each comprise a plurality of plates.

4. The embedded sensor of claim 1, wherein the plurality of transmission traces are positioned orthogonally to the plurality of coupling traces.

5. The embedded sensor of claim 1, wherein the fringing field regions form a rectangular array.

6. The embedded sensor of claim 1, further comprising a first switch operably coupled to the plurality of transmission traces and a second switch operably coupled to the plurality of coupling traces, wherein the switch is configured to select one of the plurality of coupling traces and one of the plurality of transmission traces.

7. The embedded sensor of claim 6, further comprising a processor operably coupled to the first switch and the second switch, and configured to:
    select a transmission trace and a coupling traces from the plurality of transmission traces and coupling traces;
    measure a capacitance between the transmission trace and the coupling trace.

8. A method comprising:
    transmitting a megahertz-frequency signal through a transmission trace disposed on a textile substrate;
    measuring capacitance at a coupling trace, wherein the coupling trace is electrically coupled to the transmission trace and disposed on the textile substrate; and
    determining a property of an object based on the capacitance, wherein measuring the capacitance comprises, at a single-channel measurement port selectively coupled to the transmission trace and the coupling trace, obtaining a reflection coefficient S11 and determining the capacitance from a phase of the reflection coefficient.

9. The method of claim 8, further comprising transmitting a second signal through a second transmission trace and measuring an electrical coupling value between the transmission trace and the second transmission trace.

10. The method of claim 8, further comprising transmitting signals through a plurality of transmission traces and a measuring capacitance at a plurality of coupling traces.

11. The method of claim 10, further comprising using a switch to switch between the plurality of transmission traces.

12. The method of claim 10, further comprising using a switch to switch between a plurality of coupling traces.

13. The method of claim 8, wherein the property of the object is a presence, size, distance, material property or location of the object.

14. A system comprising:
an embedded sensor disposed on a textile substrate comprising:
a plurality of transmission traces disposed on the textile substrate;
a plurality of coupling traces disposed on the textile substrate; and
a plurality of fringing field regions formed by adjacent transmission traces and coupling traces wherein the embedded sensor is configured to operate without a ground plane adjacent to the plurality of transmission traces and the plurality of coupling traces;
a computing device operably coupled to the embedded sensor, wherein the computing device comprises at least one processor and memory, the memory having computer-executable instructions stored thereon that, when executed by the at least one processor, cause the at least one processor to:
transmit a signal through a transmission trace;
measure a capacitance at a coupling trace, wherein the coupling trace is electrically coupled to the transmission trace;
determine a property of an object based on the capacitance;
and output the property of the object.

15. The system of claim 14, wherein the property of the object is a presence, size, distance, material property or location of the object.

16. The system of claim 14, further comprising a portable electronic device operably coupled to the computing device, wherein the portable electronic device is configured to: receive the property of the object.

17. The system of claim 16, wherein the portable electronic device is configured to display the property of the object on a graphical user interface (GUI).

18. The system of claim 16, wherein the portable electronic device is further configured to: output an alarm based on the property of the object.

19. The system of claim 14, wherein the embedded sensor further comprises a plurality of transmission traces and a plurality of coupling traces, and a switch operably coupled to the plurality of coupling traces and configured to select a coupling trace from the plurality of coupling traces.

20. The system of claim 14, wherein the embedded sensor further comprises a plurality of transmission traces and a plurality of coupling traces, and wherein the computing device is further configured to measure a plurality of capacitances of the plurality of transmission traces and the plurality of coupling traces, and wherein the property of the object is based on the plurality of capacitances.

* * * * *